United States Patent
Bu et al.

(10) Patent No.: US 10,593,802 B2
(45) Date of Patent: Mar. 17, 2020

(54) FORMING A SACRIFICIAL LINER FOR DUAL CHANNEL DEVICES

(71) Applicant: TESSERA, INC., San Jose, CA (US)

(72) Inventors: Huiming Bu, Glenmont, NY (US); Kangguo Cheng, Schenectady, NY (US); Dechao Guo, Niskayuna, NY (US); Sivananda K. Kanakasabapathy, Niskayuna, NY (US); Peng Xu, Guilderland, NY (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 15/629,280

(22) Filed: Jun. 21, 2017

(65) Prior Publication Data

US 2018/0090606 A1    Mar. 29, 2018

Related U.S. Application Data

(62) Division of application No. 15/395,637, filed on Dec. 30, 2016, which is a division of application No. 15/276,029, filed on Sep. 26, 2016, now Pat. No. 9,773,893.

(51) Int. Cl.
| | |
|---|---|
| *H01L 21/76* | (2006.01) |
| *H01L 29/78* | (2006.01) |
| *H01L 29/66* | (2006.01) |
| *H01L 29/10* | (2006.01) |
| *H01L 29/16* | (2006.01) |

(Continued)

(52) U.S. Cl.
CPC ........ *H01L 29/785* (2013.01); *H01L 21/3065* (2013.01); *H01L 21/324* (2013.01); *H01L 21/823431* (2013.01); *H01L 21/823821* (2013.01); *H01L 21/845* (2013.01); *H01L 29/0649* (2013.01); *H01L 29/0653* (2013.01); *H01L 29/1037* (2013.01); *H01L 29/16* (2013.01); *H01L 29/161* (2013.01);

(Continued)

(58) Field of Classification Search
CPC ............ H01L 21/823418–823431; H01L 21/823814–823821; H01L 21/845; H01L 27/0886–0924; H01L 27/10826; H01L 27/10879; H01L 27/121; H01L 29/41791; H01L 29/66772; H01L 29/66795; H01L 29/7831; H01L 29/785; H01L 2924/13067
See application file for complete search history.

(56) References Cited

U.S. PATENT DOCUMENTS

| | | |
|---|---|---|
| 7,517,764 B2 | 4/2009 | Booth, Jr. et al. |
| 7,667,258 B2 | 2/2010 | Sandhu et al. |

(Continued)

OTHER PUBLICATIONS

List of IBM Patents or Patent Applications Treated as Related dated Jun. 21, 2017, 2 pages.

*Primary Examiner* — Cuong B Nguyen

(57) ABSTRACT

Semiconductor devices include one or more fins. Each fin includes a top channel portion formed from a channel material and a bottom substrate portion formed from a same material as an underlying substrate, the top channel portion having a different width than the bottom substrate portion. An isolation dielectric layer formed between and around the bottom substrate portion of the one or more fins. A space exists between at least a top portion of the isolation dielectric layer and the one or more fins. A gate dielectric is formed over the one or more fins and in the space.

20 Claims, 7 Drawing Sheets

(51) Int. Cl.
  *H01L 29/161* (2006.01)
  *H01L 29/06* (2006.01)
  *H01L 21/8234* (2006.01)
  *H01L 21/8238* (2006.01)
  *H01L 21/84* (2006.01)
  *H01L 21/3065* (2006.01)
  *H01L 21/324* (2006.01)

(52) U.S. Cl.
  CPC .. *H01L 29/66795* (2013.01); *H01L 29/66818* (2013.01); *H01L 29/7851* (2013.01)

(56) References Cited

U.S. PATENT DOCUMENTS

| | | | |
|---|---|---|---|
| 8,120,060 B2 | 2/2012 | Fitzgerald | |
| 8,580,659 B2 | 11/2013 | Zhang et al. | |
| 8,809,947 B1 | 8/2014 | Akarvardar et al. | |
| 8,841,711 B1 | 9/2014 | Cai et al. | |
| 8,993,399 B2 | 3/2015 | Cheng et al. | |
| 9,129,863 B2 | 9/2015 | Caimi et al. | |
| 9,293,373 B1 | 3/2016 | Cheng et al. | |
| 2008/0119020 A1* | 5/2008 | Grisham | H01L 21/76232 438/221 |
| 2010/0230757 A1 | 9/2010 | Chen et al. | |
| 2011/0097889 A1 | 4/2011 | Yuan et al. | |
| 2012/0256244 A1* | 10/2012 | Grisham | H01L 21/76232 257/296 |
| 2014/0197457 A1* | 7/2014 | Wang | H01L 29/785 257/192 |
| 2014/0225065 A1 | 8/2014 | Rachmady et al. | |
| 2015/0228670 A1 | 8/2015 | Caimi et al. | |
| 2015/0270289 A1 | 9/2015 | Caimi et al. | |
| 2016/0064288 A1 | 3/2016 | Cheng et al. | |
| 2016/0190303 A1 | 6/2016 | Liu et al. | |
| 2017/0103985 A1* | 4/2017 | Kim | H01L 21/823821 |
| 2017/0117363 A1* | 4/2017 | Kim | H01L 29/1054 |

\* cited by examiner

FORMING A SACRIFICIAL LINER FOR DUAL CHANNEL DEVICES

BACKGROUND

Technical Field

The present invention generally relates to dual channel semiconductor devices and, more particularly, to the fabrication of such devices using a sacrificial liner that protects the channel during an oxide anneal.

Description of the Related Art

The fabrication of semiconductor devices frequently uses "shallow trench isolation" (STI) techniques to separate different devices and different device structures. STI commonly involves the formation of a trench between isolated regions and then filling that trench with a dielectric material, most commonly an oxide. Flowable oxides are used to produce STI structures that are free of seams, but a steam anneal is generally used to solidify the oxide material. If the channel structure of the device(s) is exposed to the steam anneal, this can oxidize the channel and damage or alter the properties of the device. In addition, in dual channel devices that have channels using different materials, the two channels may oxidize at different rates. A silicon nitride liner is sometimes used to prevent channel oxidation, but silicon nitride may induce a fixed charge in the device.

SUMMARY

A semiconductor devices includes one or more fins. Each fin includes a top channel portion formed from a channel material and a bottom substrate portion formed from a same material as an underlying substrate, the top channel portion having a different width than the bottom substrate portion. An isolation dielectric layer formed between and around the bottom substrate portion of the one or more fins. A space exists between at least a top portion of the isolation dielectric layer and the one or more fins. A gate dielectric is formed over the one or more fins and in the space.

A semiconductor device includes one or more fins. Each fin includes a top channel portion formed from a channel material and a bottom substrate portion formed from a same material as an underlying substrate. The top channel portion of each of the one or more fins has a width that is greater than a width of the bottom substrate portion of each respective fin. An isolation dielectric layer is formed between and around the bottom substrate portion of the one or more fins, wherein a space exists between at least a top portion of the isolation dielectric layer and the one or more fins. A gate dielectric formed over the one or more fins and in the space.

A semiconductor device includes one or more fins. Each fin includes a top channel portion formed from a channel material. A bottom substrate portion is formed from a same material as an underlying substrate. A top channel portion of each of the one or more fins has a width that is lower than a width of the bottom substrate portion of each respective fin. An isolation dielectric layer is formed between and around the bottom substrate portion of the one or more fins, wherein a space exists between at least a top portion of the isolation dielectric layer and the one or more fins. A gate dielectric is formed over the one or more fins and in the space.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention form a liner over the dual channel region(s) that protects the channels from oxidation during shallow trench isolation (STI). While unlined regions may be oxidized, the liner protects the channel region from damage and ensures consistent channel widths between the two channel materials. The channel liner may be a single-layer liner or may be a dual-layer liner as described in greater detail below. It should be understood that, although the following description provides a detailed view of a dual channel device, the present principles may be applied with equal effect to a single channel, single fin device.

Figure 1:
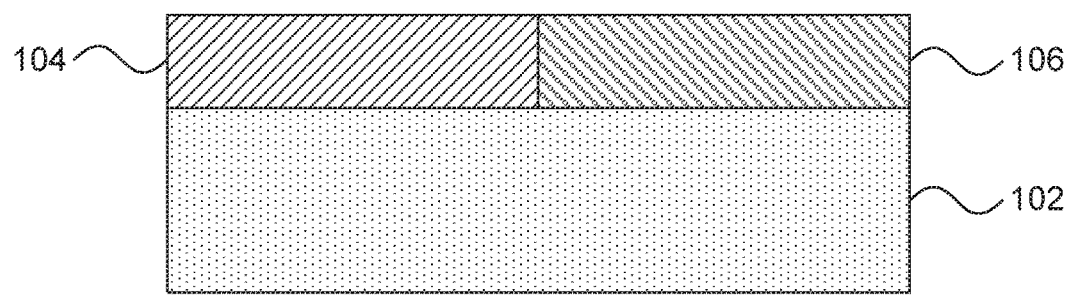
FIG. 1 is a cross-sectional diagram of a step in the formation of a semiconductor device in accordance with embodiments of the present invention.

Referring now to FIG. 1, a cross-sectional diagram of a step in forming a dual channel device is shown. Channel material films 104 and 106 are formed on a semiconductor substrate 102. The semiconductor substrate 102 may be a bulk-semiconductor substrate. In one example, the bulk-semiconductor substrate 102 may be a silicon-containing material. Illustrative examples of silicon-containing materials suitable for a bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride and zinc selenide. Although not depicted in FIG. 1, the semiconductor substrate 102 may also be a semiconductor on insulator (SOI) substrate, for example with a buried oxide layer below a semiconductor layer.

The channel films 104 and 106 are formed from different channel materials. It is specifically contemplated that the first channel film 104 may be formed from, e.g., silicon and that the second channel film 106 may be formed from, e.g., silicon germanium, but it should be understood that any appropriate pairing of two semiconductor channel materials may be used instead. As used herein, the term "channel" refers to the region of a semiconductor device, such as a field effect transistor (FET), underlying a gate structure and between a source and drain of a semiconductor device. The channel becomes conductive when the semiconductor device is turned on. A dual channel device uses multiple channel regions that have two different channel materials.

The first and second channel films 104 and 106 may be deposited by any appropriate process. It is specifically contemplated that a region of the substrate 102 may be masked, that the first channel film 104 may be deposited, that the mask may be removed and replaced with a mask on the first channel film 104, and that the second channel film 106 may then be deposited. Exemplary deposition processes include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
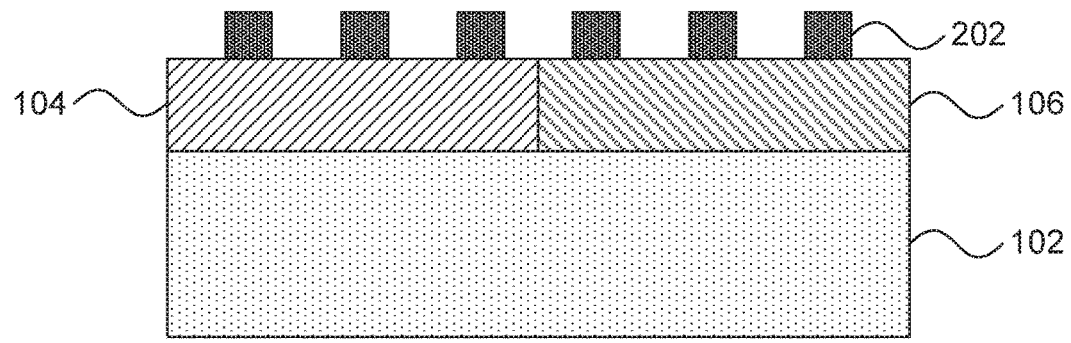
FIG. 2 is a cross-sectional diagram of a step in the formation of a semiconductor device in accordance with embodiments of the present invention.

Referring now to FIG. 2, a cross-sectional diagram of a step in forming a dual channel device is shown. Fin masks 202 are patterned on top of the first channel film 104 and the second channel film 106. It should be understood that embodiments may employ any appropriate soft and/or hardmask material for the fin masks. Fin masks 202 can be formed using deposition, photolithography and etching. In some embodiments, the fin masks 202 are formed of a nitride-containing material, such as silicon nitride. It is noted that it is not intended that the fin masks 202 be limited to only silicon nitride, as the composition of the mask may include any dielectric material that may be deposited by CVD and related methods. Other mask compositions for the fin mask may include silicon oxides, silicon oxynitrides, silicon carbides, silicon carbonitrides, etc. Spin-on dielectrics may also be utilized as a hardmask material including, but not limited to: silsequioxanes, siloxanes, and boron phosphate silicate glass (BPSG).

In one embodiment, fin masks 202 may be formed by blanket depositing a layer of hardmask material, providing a patterned photoresist on the layer of hardmask material, and then etching the layer of hardmask material to provide fin masks 202 protecting at least one portion of the channel films 104 and 106. A patterned photoresist can be produced by applying a blanket photoresist layer to the surface of channel films 104 and 106, exposing the photoresist layer to a pattern of radiation, and then developing the pattern into the photoresist layer utilizing resist developer. Etching of the exposed portion of the fin masks 202 may include an etch chemistry for removing the exposed portion of the hardmask material and having a high selectivity to at least the fin masks 202 and the channel materials. In one embodiment, the etch process may be an anisotropic etch process, such as reactive ion etch (RIE).

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used to etch the fin masks 202 include ion beam etching, plasma etching or laser ablation.

Figure 3:
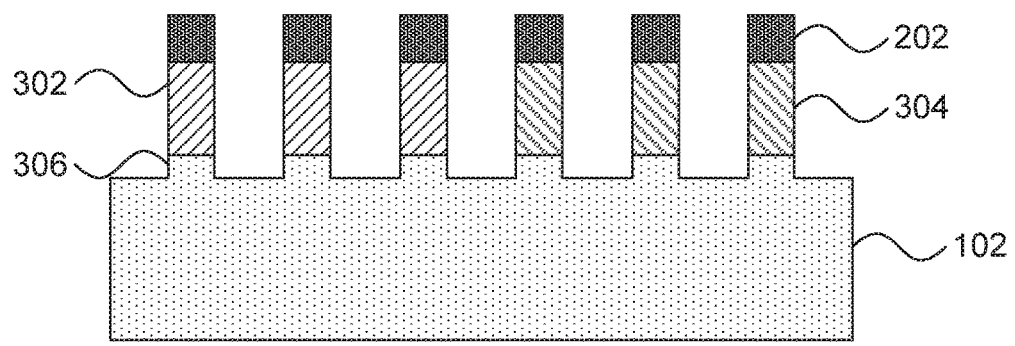
FIG. 3 is a cross-sectional diagram of a step in the formation of a semiconductor device in accordance with embodiments of the present invention.

Referring now to FIG. 3, a cross-sectional diagram of a step in forming a dual channel device is shown. The fin masks 202 are used to mask an etch process that forms fins from the first and second channel films 104/106, producing first channel fins 302 and second channel fins 304. It is specifically contemplated that RIE may be used to anisotropically etch the material, but it should be understood that any appropriate anisotropic etch may be used. The etch can be timed to fully penetrate the first channel film 104 and the second channel film 106 and to partially etch the underlying substrate 102, forming substrate caps 306.

Figure 4:
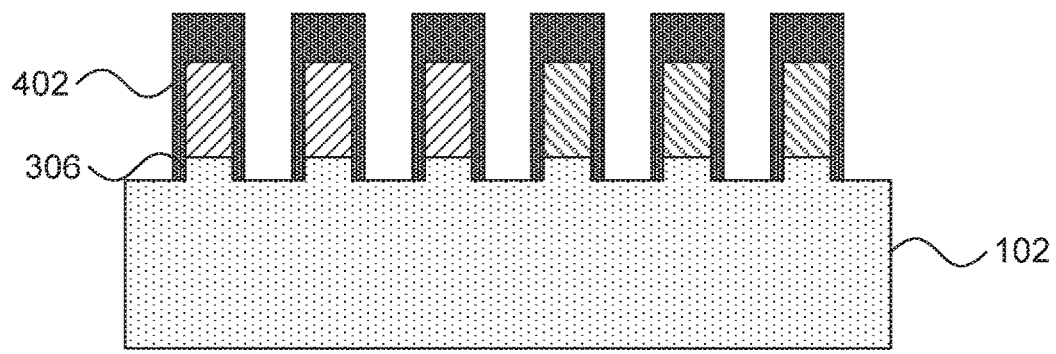
FIG. 4 is a cross-sectional diagram of a step in the formation of a semiconductor device in accordance with embodiments of the present invention.

Referring now to FIG. 4, a cross-sectional diagram of a step in forming a dual channel device is shown. A liner 402 is formed over the channel fins 302/304 and the fin mask 202. It is specifically contemplated that the liner may be formed from the same material as the fin mask 202 (e.g., silicon nitride), with liner material being conformally deposited over every exposed surface. The liner material may then be anisotropically etched using, e.g., RIE to remove the liner material from horizontal surfaces, leaving the liners 402 along the vertical sidewalls of the fins 302/304. In one embodiment, a buffer oxide layer (not shown) may be deposited or grown before the formation of the liners 402.

The buffer oxide may be conformally deposited by, e.g., ALD to improve adhesion of the liners 402 to the channel fins 302/304.

Figure 5:
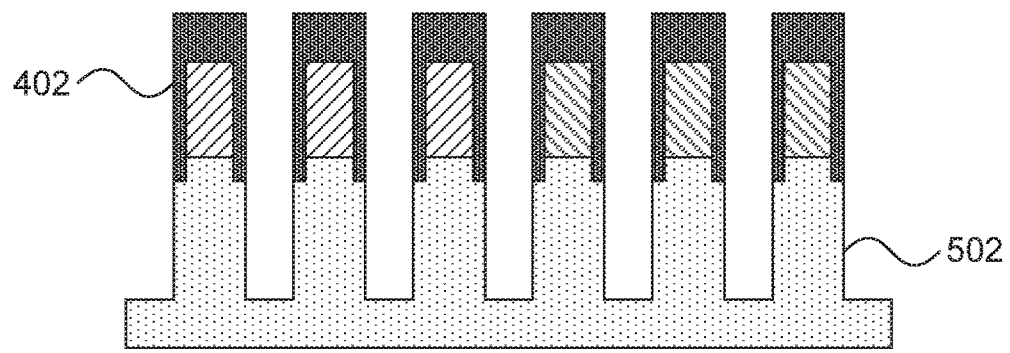
FIG. 5 is a cross-sectional diagram of a step in the formation of a semiconductor device in accordance with embodiments of the present invention.

Referring now to FIG. 5, a cross-sectional diagram of a step in forming a dual channel device is shown. The substrate 102 is further anisotropically etched using, e.g., RIE with the liner 402 acting as a mask. The resulting semiconductor fins 502 are formed in the substrate material below the substrate caps 306, with a width that is greater than the width of the channel fins 302/304 due to the width contribution of the liners 402. It should be noted that the trenches that are formed between the semiconductor fins 502 may taper at the bottom—there is no need for the semiconductor fin sidewalls to be perfectly vertical.

Figure 6:
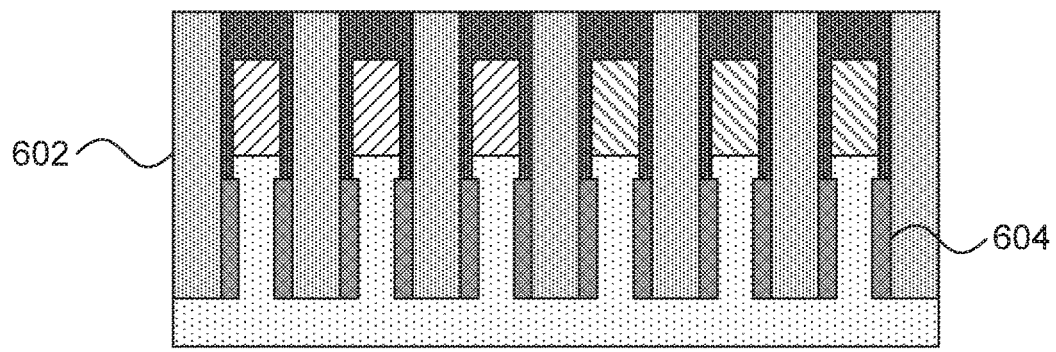
FIG. 6 is a cross-sectional diagram of a step in the formation of a semiconductor device in accordance with embodiments of the present invention.

Referring now to FIG. 6, a cross-sectional diagram of a step in forming a dual channel device is shown. The trenches are filled with an STI layer 602 such as, e.g., silicon dioxide. Although silicon dioxide is specifically contemplated, it should be understood that any appropriate flowable dielectric material may be used instead. The flowable dielectric material is, e.g., spun on and then annealed to solidify the STI material. After solidification, the STI material may be polished down to expose the liners 402 using, e.g., chemical mechanical planarization (CMP).

CMP is performed using, e.g., a chemical or granular slurry and mechanical force to gradually remove upper layers of the device. The slurry may be formulated to be unable to dissolve, for example, the mask material, resulting in the CMP process's inability to proceed any farther than that layer.

The anneal process used to solidify the STI material 602 will oxidize the exposed portions of the semiconductor fins 502 to form oxide layers 604, leaving remaining portions 606 of the semiconductor fins 502 beyond an oxidation depth unaffected. Notably the oxide layers 604 do not extend into the semiconductor caps 306 or into the first or second channel fins 302/304. The liners 402 protect the underlying channel structures 302/304 from the oxidizing effect of the anneal. As a result of the partial oxidation of the semiconductor fins 502, the channel fins 302/304 will have a different fin width as compared to the remaining semiconductor fins 606.

Figure 7:
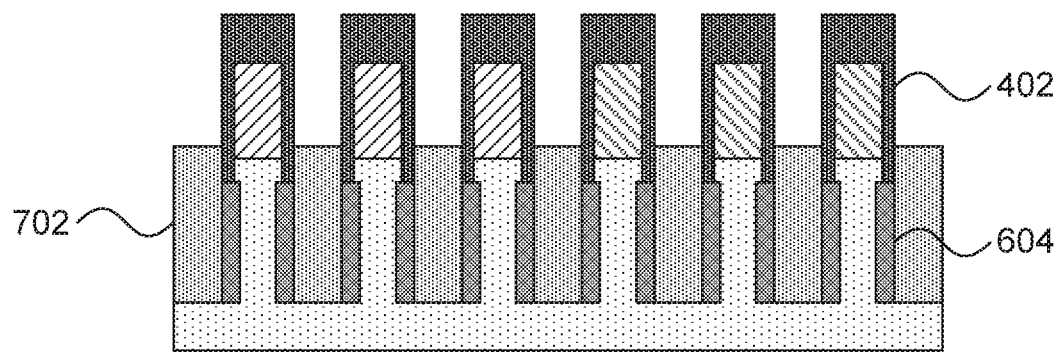
FIG. 7 is a cross-sectional diagram of a step in the formation of a semiconductor device in accordance with embodiments of the present invention.

Referring now to FIG. 7, a cross-sectional diagram of a step in forming a dual channel device is shown. The STI layer 602 is recessed using, e.g., an anisotropic etch such as RIE or a wet or dry chemical etch. In some embodiments, the etched STI layer 702 has a height that is above the bottom edge of the liners 402. The liners 402 protect the channel fins 302/304 from the STI etch process.

Figure 8:
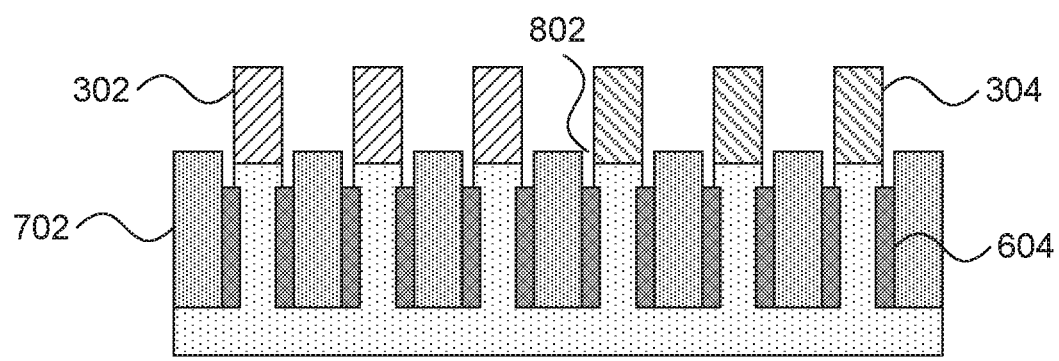
FIG. 8 is a cross-sectional diagram of a step in the formation of a semiconductor device in accordance with embodiments of the present invention.

Referring now to FIG. 8, a cross-sectional diagram of a step in forming a dual channel device is shown. The liners 402 are etched away using any appropriate etch process such as, e.g., a wet or dry chemical etch that selectively removes the liner material and the mask material without harming the underling first channel fins 302 and second channel fins 304. The removal of the liners 402 leaves divots 802 between the fins 302/304 and the recessed STI layer 702.

Figure 9:
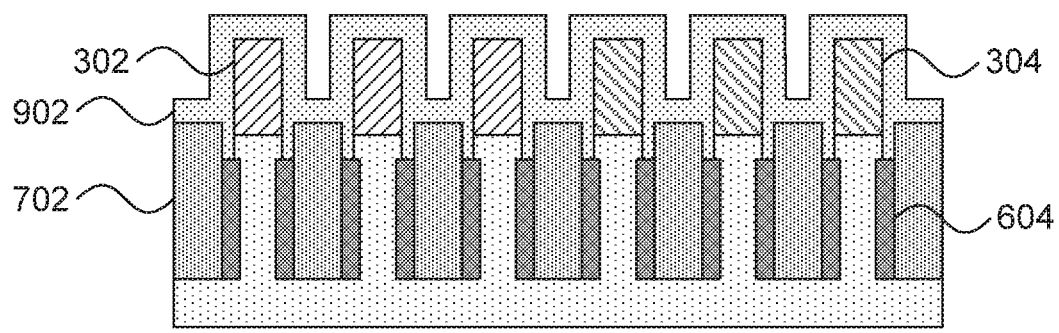
FIG. 9 is a cross-sectional diagram of a step in the formation of a semiconductor device in accordance with embodiments of the present invention.

Referring now to FIG. 9, a cross-sectional diagram of a step in forming a dual channel device is shown. A gate dielectric layer 902 is conformally deposited over the first and second channel fins 302/304 and the recessed STI layer 702. The gate dielectric layer 902 at least partially fills the divots 802 and pinches off there. After formation of the gate dielectric 902 over the first and second channel fins 302/304, a common gate structure (not shown) may be formed using any appropriate material or fabrication process.

The gate dielectric layer 902 may be formed from any appropriate dielectric material. In some applications, such as input/output devices where a high tolerance to voltage and current is needed, a thick oxide gate dielectric formed from, e.g., silicon dioxide may be used. In other applications, a high-k dielectric material (i.e., a dielectric having a dielectric constant greater than that of silicon dioxide) may be used. Some embodiments will deposit an oxide layer first and subsequently replace that layer with a high-k dielectric to improve performance. Exemplary gate dielectric materials include, e.g., silicon dioxide, tantalum oxides, zirconium oxides, aluminum oxides, hafnium oxides, lanthanum oxides, titanium oxides, strontium titanium oxides, lanthanum aluminum oxides, yttrium oxides, hafnium oxynitrides, zirconium oxynitrides, lanthanum oxynitrides, aluminum oxynitrides, titanium oxynitrides, strontium titanium oxynitrides, lanthanum aluminum oxynitrides, yttrium oxynitrides, silicates thereof, alloys thereof, and multilayers thereof.

Figure 10:
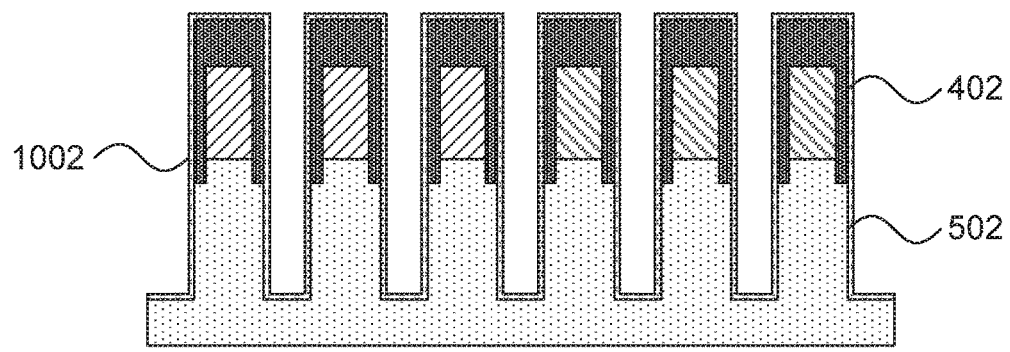
FIG. 10 is a cross-sectional diagram of a step in the formation of a semiconductor device in accordance with embodiments of the present invention.

Referring now to FIG. 10, a cross-sectional diagram of a step in forming an alternative embodiment of a dual channel device is shown. This step picks up after the formation of semiconductor fins 502 in FIG. 5. A second liner layer 1002 is conformally formed over the liners 402 and the semiconductor fins 502. It is specifically contemplated that the second liner layer 1002 can be polysilicon and can be formed by CVD, but it should be understood that any appropriate deposition process may be used instead.

Figure 11:
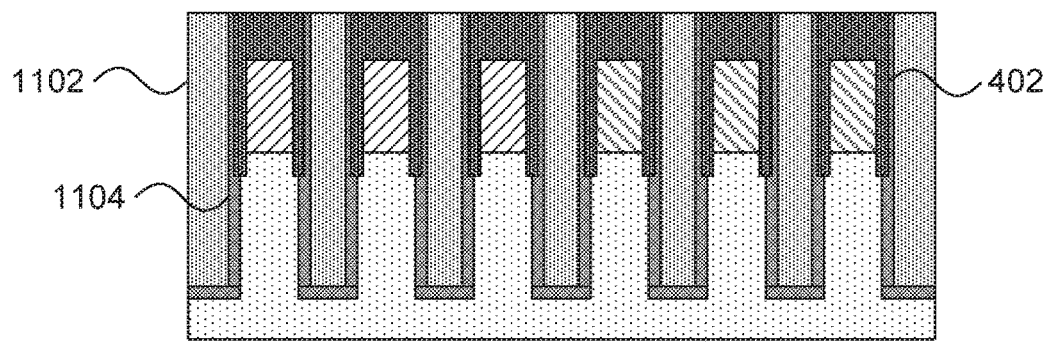
FIG. 11 is a cross-sectional diagram of a step in the formation of a semiconductor device in accordance with embodiments of the present invention.

Referring now to FIG. 11, a cross-sectional diagram of a step in forming an alternative embodiment of a dual channel device is shown. As above in FIG. 6, an STI layer 1102 is deposited using, e.g., a flowable dielectric material such as a flowable oxide. As with the first embodiment, the anneal used in forming the STI layer 1102 oxidizes material in the semiconductor fins 502 and the second liner 1002. However, the oxidation 1104 of the semiconductor fins 502 is decreased by the presence of the second liner 1002, which diminishes the stress/strain induced by the oxidation. In addition, the use of the second liner layer 1002 means that a thinner silicon nitride liner 402 may be used. The STI material may be polished down to the level of the first liners 402 using, e.g., CMP. The use of polysilicon in the second liner layer 1002 results in oxidized polysilicon that helps anchor the fins and helps prevent fin bending.

Figure 12:
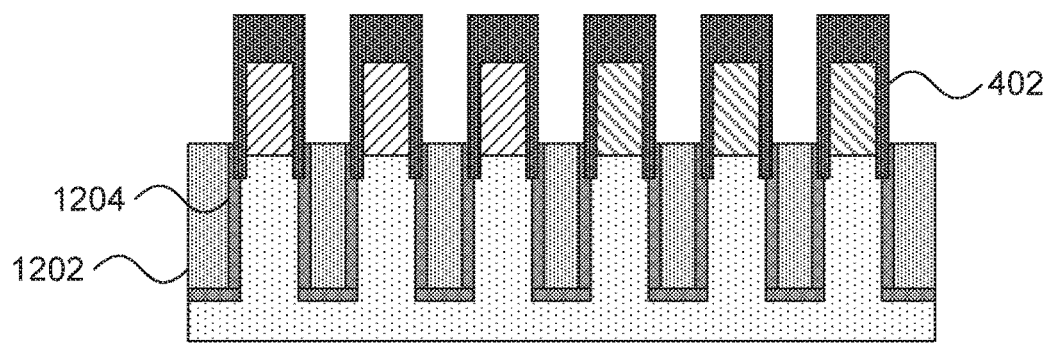
FIG. 12 is a cross-sectional diagram of a step in the formation of a semiconductor device in accordance with embodiments of the present invention.

Referring now to FIG. 12, a cross-sectional diagram of a step in forming an alternative embodiment of a dual channel device is shown. As above, the STI layer 1102 is recessed to a point above the height of the bottom edge of the channel fins 302/304. Portions of the oxidized layer 1104 are removed as well, with the lower oxidized portions 1204 remaining.

Figure 13:
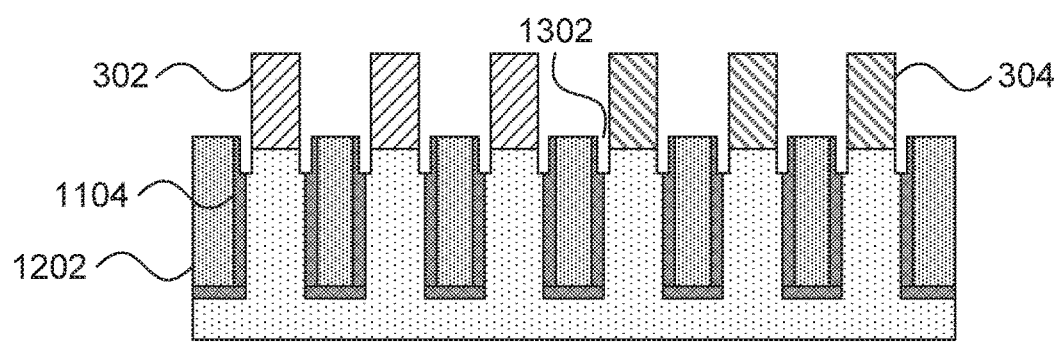
FIG. 13 is a cross-sectional diagram of a step in the formation of a semiconductor device in accordance with embodiments of the present invention.

Referring now to FIG. 13, a cross-sectional diagram of a step in forming an alternative embodiment of a dual channel device is shown. The liners 402 are removed, exposing divots 1302 between the top portions of the oxidized regions 1104 and the semiconductor caps 306. As above, the width of the channel fins 302/304 is different from that of the partially oxidized underlying semiconductor fins 502, in this case with the channel fins 302/304 being narrower than the partially oxidized underling semiconductor fins 502.

Figure 14:
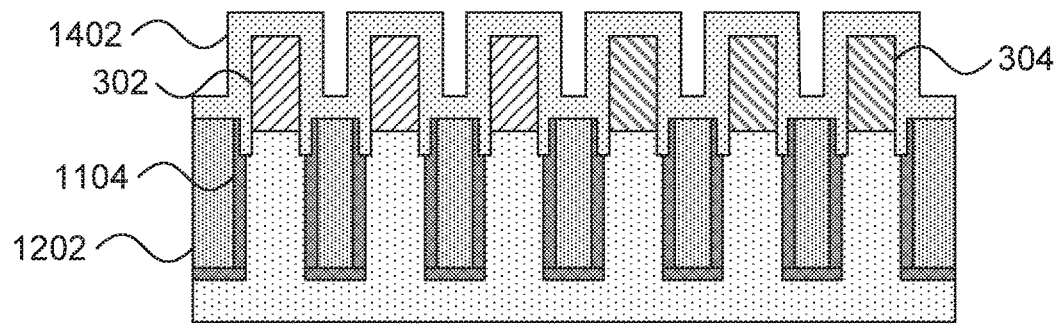
FIG. 14 is a cross-sectional diagram of a step in the formation of a semiconductor device in accordance with embodiments of the present invention.

Referring now to FIG. 14, a cross-sectional diagram of a step in forming an alternative embodiment of a dual channel device is shown. A gate dielectric layer 1402 is conformally deposited over the first and second channel fins 302/304 and the recessed STI layer 1202. The gate dielectric layer 1402 at least partially fills the divots 1302 and pinches off there. After formation of the gate dielectric 1402 over the first and second channel fins 302/304, a common gate structure (not shown) may be formed using any appropriate material or fabrication process.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-1}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed herein could be termed a second element without departing from the scope of the present concept.

Figure 15:
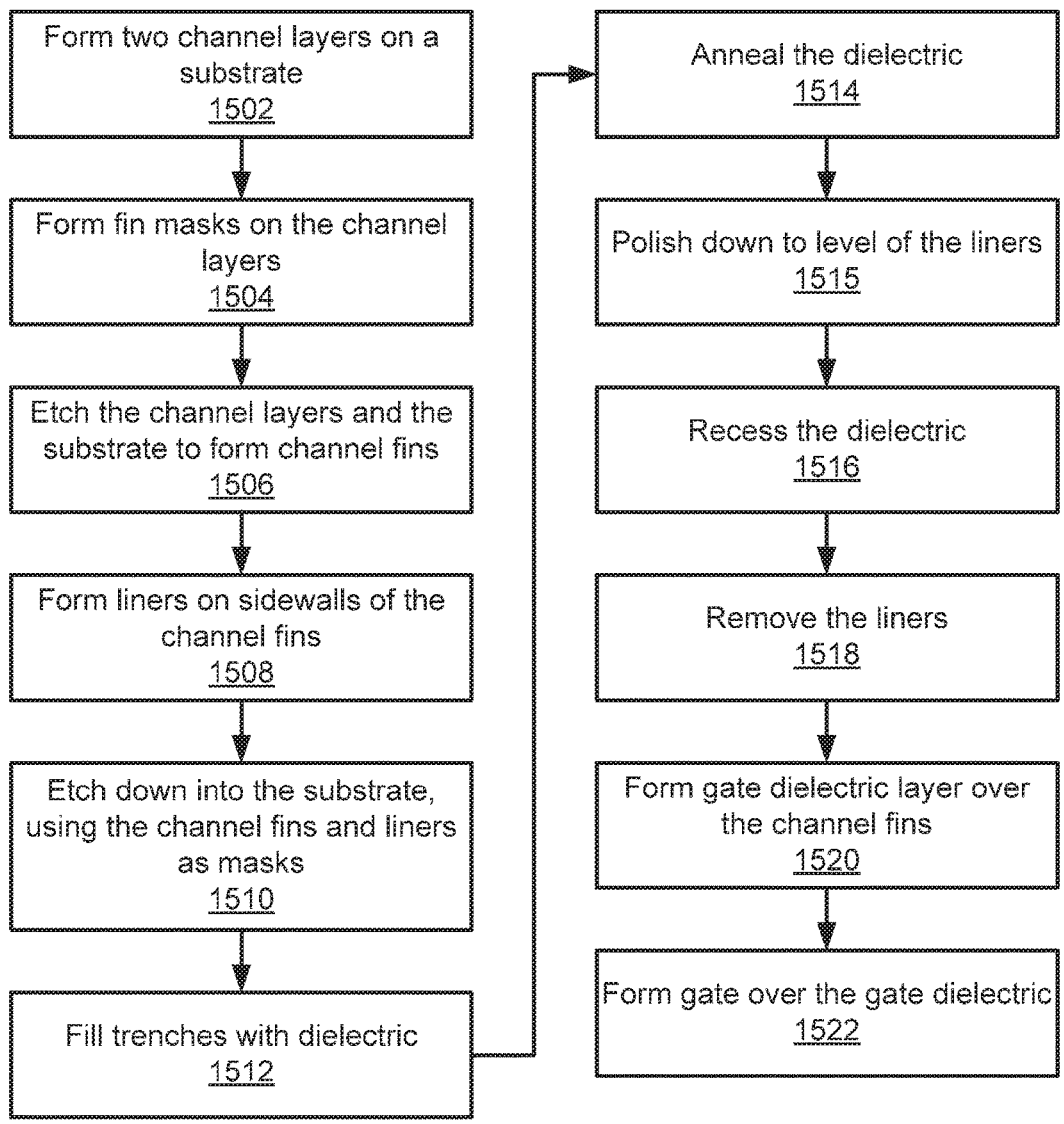
FIG. 15 is a block/flow diagram of a method of forming a semiconductor device in accordance with embodiments of the present invention.

Referring now to FIG. 15, a method of forming dual channel semiconductor devices is shown. Block 1502 forms two channel film layers 104 and 106 on a semiconductor substrate 1502. Exemplary materials for the channel film layers 104 and 106 include silicon and silicon germanium, respectively. Block 1504 forms the fin masks 202 on the channel layers 104 and 106 from, e.g., hardmask material using photolithographic processes.

Block 1506 etches the channel layer 104/106 around the fin masks 202 using an anisotropic etch such as RIE to form channel fins 302/304. The etch goes beyond the channel layers 104/106 and into the substrate 102 to form substrate caps 306. Block 1308 forms liners 402 on the sidewalls of the channel fins 302/304. The liners 402 may be formed from, e.g., silicon nitride and may be the same material as the fin masks 202.

Block 1510 etches down into the substrate 102 using the channel fins 302/304 and the liners 402 as masks, creating semiconductor fins 502. Block 1512 fills the trenches between the fins with dielectric material such as, e.g., a flowable silicon dioxide. Block 1514 then anneals the dielectric to cause the flowable dielectric to solidify. One effect of the anneal is that the sidewalls of the semiconductor fins 502 oxidize to form oxide layers 604. Block 1515 polishes the solidified dielectric down to the level of the liners 402 to form the STI layer 602.

Block 1516 recesses the STI layer 602 using, e.g., a timed RIE or a wet or dry chemical etch. Block 1518 then strips away the liners 402 to expose the first and second channel fins 302 and 304 as well as divots 802. Block 1520 forms a gate dielectric layer 902 over the channel fins 302/304 and in block 1522 forms a gate over the gate dielectric layer.

Figure 16:
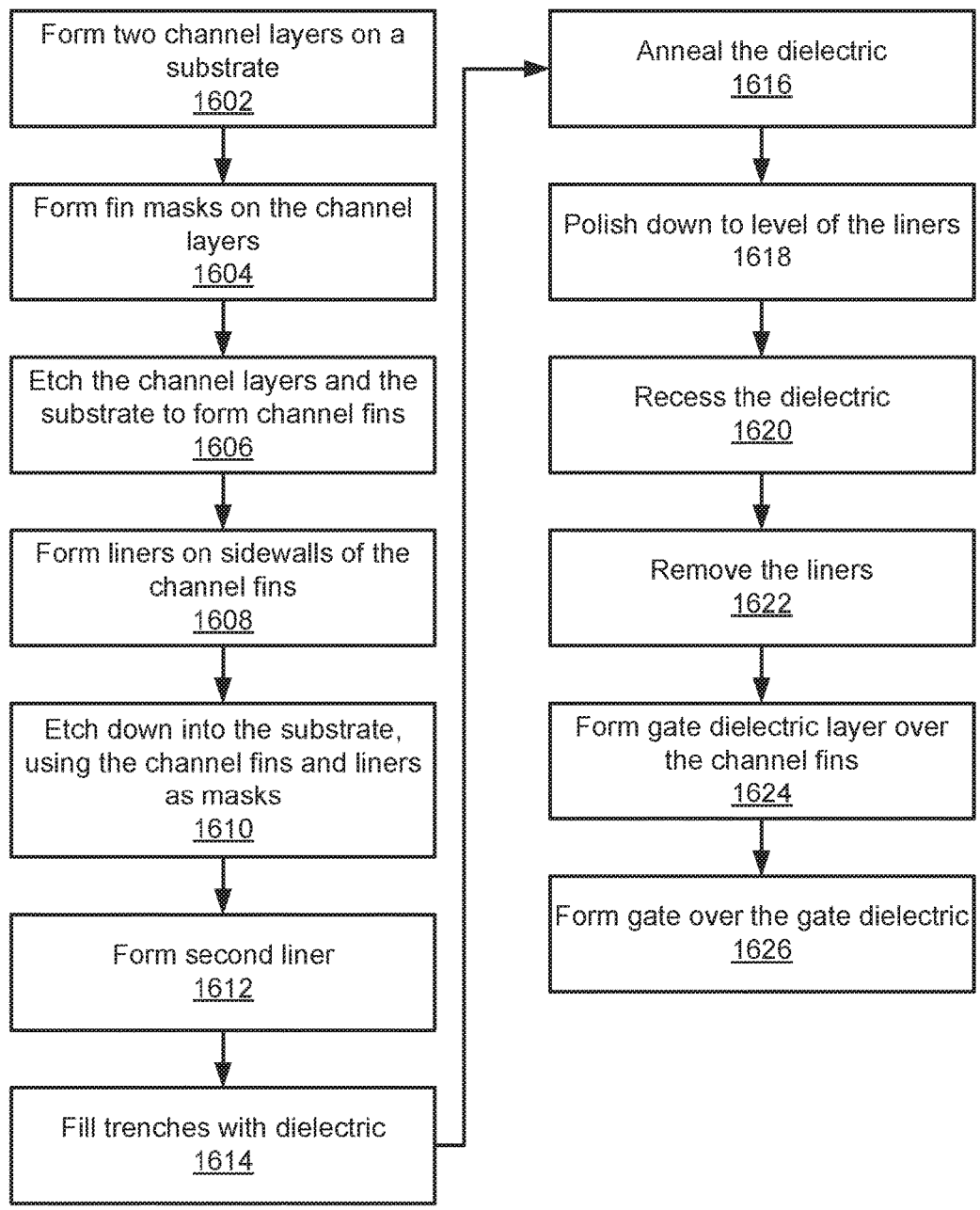
FIG. 16 is a block/flow diagram of a method of forming a semiconductor device in accordance with embodiments of the present invention.

Referring now to FIG. 16, a method of forming dual channel semiconductor devices is shown. Block 1602 forms two channel film layers 104 and 106 on a semiconductor substrate 1602. Exemplary materials for the channel film layers 104 and 106 include silicon and silicon germanium, respectively. Block 1604 forms the fin masks 202 on the channel layers 104 and 106 from, e.g., hardmask material using photolithographic processes.

Block 1606 etches the channel layer 104/106 around the fin masks 202 using an anisotropic etch such as RIE to form channel fins 302/304. The etch goes beyond the channel layers 104/106 and into the substrate 102 to form substrate caps 306. Block 1308 forms liners 402 on the sidewalls of the channel fins 302/304. The liners 402 may be formed from, e.g., silicon nitride and may be the same material as the fin masks 202.

Block 1610 etches down into the substrate 102 using the channel fins 302/304 and the liners 402 as masks, creating semiconductor fins 502. Block 1612 forms a second liner 1002 on the sidewalls of the semiconductor fins 502 and the first liner 402 from, e.g., polysilicon in a conformal deposition process.

Block 1614 fills the trenches between the fins with dielectric material such as, e.g., a flowable silicon dioxide. Block 1616 then anneals the dielectric to cause the flowable dielectric to solidify. One effect of the anneal is that the sidewalls of the second liner 1002 and some portions of the semiconductor fins 502 oxidize to form oxide layers 1104. Block 1618 polishes the solidified dielectric down to the level of the liners 402 to form the STI layer 1102.

Block 1620 recesses the STI layer 1102 using, e.g., a timed RIE or a wet or dry chemical etch. Block 1622 then strips away the liners 402 to expose the first and second channel fins 302 and 304 as well as divots 1302. Block 1624 forms a gate dielectric layer 1402 over the channel fins 302/304 and block 1626 forms a gate over the gate dielectric layer.

Having described preferred embodiments of forming a sacrificial liner for dual channel devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
   one or more fins, each fin comprising:
   a top channel portion formed from a channel material; and
   a bottom substrate portion formed from a same material as an underlying substrate, the top channel portion having a different width than the bottom substrate portion;
   an isolation dielectric layer formed between and around the bottom substrate portion of the one or more fins;
   a single oxide layer formed in direct contact with the bottom substrate portion of each fin, between the bottom substrate portion of each fin and the isolation dielectric layer, wherein a space exists between a straight sidewall of at least a top portion of the single oxide layer and an adjacent sidewall of the one or more fins; and
   a gate dielectric formed over the one or more fins and in the space, in contact with both the straight sidewall of at least the top portion of the single oxide layer and the bottom substrate portion.

2. The semiconductor device of claim 1, comprising a plurality of such fins, wherein a first subset of the plurality of fins comprises a top channel portion formed from a first channel material and wherein a second subset of the plurality of fins comprises a top channel portion formed from a second channel material.

3. The semiconductor device of claim 2, wherein the first channel material is silicon and wherein the second channel material is silicon germanium.

4. The semiconductor device of claim 1, wherein a top channel portion of each of the one or more fins has a width that is lower than a width of the bottom substrate portion of each respective fin.

5. The semiconductor device of claim 4, wherein each fin further comprises a middle portion formed from a same material as the underlying substrate and having a width that is lower than the width of the bottom substrate portion.

6. The semiconductor device of claim 1, wherein the single oxide layer has a height greater than a bottom surface of the top channel portion of each fin.

7. The semiconductor device of claim 1, wherein the single oxide layer has a stepped top portion.

8. The semiconductor device of claim 7, wherein a first step of the stepped top portion has a first height that is lower than a bottom surface of the top channel portion of each fin and a second step of the stepped top portion has a second height that is greater than the bottom surface of the top channel portion of each fin.

9. The semiconductor device of claim 1 wherein the straight sidewall of at least the top portion of the single oxide layer is vertical with respect to the underlying substrate.

10. A semiconductor device, comprising:
    one or more fins, each fin comprising:
    a top channel portion formed from a channel material; and
    a bottom substrate portion formed from a same material as an underlying substrate, wherein a top channel portion of each of the one or more fins has a width that is lower than a width of the bottom substrate portion of each respective fin;

an isolation dielectric layer formed between and around the bottom substrate portion of the one or more fins;
a single oxide layer formed in direct contact with the bottom substrate portion of each fin, between the bottom substrate portion of each fin and the isolation dielectric layer, wherein a space exists between a straight sidewall of at least a top portion of the single oxide layer and an adjacent sidewall the one or more fins; and
a gate dielectric formed over the one or more fins and in the space, in contact with both the straight sidewall of at least the top portion of the single oxide layer and the bottom substrate portion.

11. The semiconductor device of claim 10, comprising a plurality of such fins, wherein a first subset of the plurality of fins comprises a top channel portion formed from a first channel material and wherein a second subset of the plurality of fins comprises a top channel portion formed from a second channel material.

12. The semiconductor device of claim 11, wherein the first channel material is silicon and wherein the second channel material is silicon germanium.

13. The semiconductor device of claim 10, wherein each fin further comprises a middle portion formed from a same material as the underlying substrate and having a width that is lower than the width of the bottom substrate portion.

14. The semiconductor device of claim 10, wherein the single oxide layer has a height greater than a bottom surface of the top channel portion of each fin.

15. The semiconductor device of claim 10, wherein the single oxide layer has a stepped top portion.

16. The semiconductor device of claim 15, wherein a first step of the stepped top portion has a first height that is lower than a bottom surface of the top channel portion of each fin and a second step of the stepped top portion has a second height that is greater than the bottom surface of the top channel portion of each fin.

17. The semiconductor device of claim 10 wherein the straight sidewall of at least the top portion of the single oxide layer is parallel to the adjacent sidewall of the one or more fins.

18. A semiconductor device, comprising:
one or more fins, each fin comprising:
a top channel portion formed from a channel material;
a bottom substrate portion formed from a same material as an underlying substrate, wherein the top channel portion of each of the one or more fins has a width that is lower than a width of the bottom substrate portion of each respective fin; and
a middle portion formed from a same material as the underlying substrate and having a width that is lower than the width of the bottom substrate portion;
an isolation dielectric layer formed between and around the bottom substrate portion of the one or more fins;
a single oxide layer formed in direct contact with the bottom substrate portion of each fin, between the bottom substrate portion of each fin and the isolation dielectric layer, wherein a space exists between a straight sidewall of at least a top portion of the single oxide layer and an adjacent sidewall of the one or more fins; and
a gate dielectric formed over the one or more fins and in the space, in contact with both the straight sidewall of at least the top portion of the single oxide layer and the bottom substrate portion.

19. The semiconductor device of claim 18, comprising a plurality of such fins, wherein a first subset of the plurality of fins comprises a top channel portion formed from a first channel material and wherein a second subset of the plurality of fins comprises a top channel portion formed from a second channel material.

20. The semiconductor device of claim 19, wherein the first channel material is silicon and wherein the second channel material is silicon germanium.

* * * * *